United States Patent [19]

Nishimura et al.

[11] Patent Number: 4,683,144
[45] Date of Patent: Jul. 28, 1987

[54] METHOD FOR FORMING A DEPOSITED FILM

[75] Inventors: Yukuo Nishimura, Sagamihara; Ken Eguchi; Hiroshi Matsuda, both of Yokohama; Masahiro Haruta, Funabashi; Yutaka Hirai; Takashi Nakagiri, both of Tokyo, all of Japan

[73] Assignee: Canon Kabushiki Kaisha, Tokyo, Japan

[21] Appl. No.: 722,133

[22] Filed: Apr. 11, 1985

[30] Foreign Application Priority Data

Apr. 16, 1984 [JP] Japan .................................. 59-76126
Apr. 16, 1984 [JP] Japan .................................. 59-76127
Apr. 16, 1984 [JP] Japan .................................. 59-76130
Apr. 16, 1984 [JP] Japan .................................. 59-76131

[51] Int. Cl.$^4$ .............................................. B05D 3/06
[52] U.S. Cl. ..................................... 427/35; 427/53.1; 427/54.1; 427/86
[58] Field of Search ............... 427/35, 36, 53.1, 54.1, 427/55, 86; 204/157.1 R; 423/348, 349, 350

[56] References Cited

U.S. PATENT DOCUMENTS

| | | | |
|---|---|---|---|
| 3,490,961 | 1/1970 | Frieser et al. | 204/157.1 R |
| 3,661,637 | 5/1972 | Sirtl | 117/201 |
| 4,217,234 | 8/1980 | Ovshinsky et al. | 427/39 |
| 4,363,828 | 12/1982 | Brodsky et al. | 427/86 |
| 4,374,182 | 2/1983 | Gaul et al. | 428/446 |
| 4,448,801 | 5/1984 | Fukuda et al. | 427/54.1 |
| 4,495,218 | 1/1985 | Azuma et al. | 427/53.1 |

Primary Examiner—John H. Newsome
Attorney, Agent, or Firm—Fitzpatrick, Cella, Harper & Scinto

[57] ABSTRACT

A method for forming a deposited film comprises forming a gaseous atmosphere of a silane compound represented by the general formula: $Si_nH_{2n+2}$ ($n \geq 1$) and a halogen compound in a deposition chamber in which a substrate is arranged, and exciting and decomposing these compounds by utilization of photoenergy thereby to form the deposited film containing silicon atoms on said substrate.

A method for forming a deposited film comprises forming a gaseous atmosphere of a silane compound represented by the general formula: $Si_nH_{2n+2}$ ($n \geq 1$), a halogen compound and a compound containing atoms belonging too the group III or the group V of the periodic table in a deposition chamber in which a substrate is arranged, and exciting and decomposing these compounds by utilization of photoenergy thereby to form a deposited film containing silicon atoms and the atoms belonging to the group III or the group V of the periodic table on said substrate.

9 Claims, 2 Drawing Figures

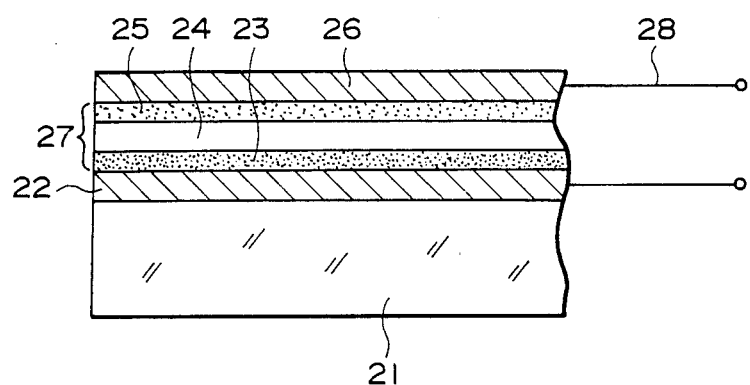
F I G. 2

METHOD FOR FORMING A DEPOSITED FILM

BACKGROUND OF THE INVENTION

1. Field of the Invention

This invention relates to a method for forming a deposited film, which comprises forming a photoconductive film, a semiconductor film or an insulating film on a substrate by utilizing light as the excitation energy, more particularly to a method for forming the deposited film containing, for example, silicon atoms on a certain substrate by creating a excited and decomposed state of a starting gas by imparting or utilizing light or light and, if desired, heat.

2. Description of the Prior Art

In the prior art, as the method for forming a deposited film of amorphous silicon (hereinafter written as "a-Si"), there have been known the glow discharge deposition method and the heat energy deposition method employing $SiH_4$ or $Si_2H_6$ as the starting material. That is, these methods comprise forming the deposited film of a-Si on the substrate by decomposing $SiH_4$ or $Si_2H_6$ as the starting material by electric energy or heat energy (excitation energy), and the deposited film has been utilized for various purposes as the photoconductive film, semiconductor, insulating film or the like.

However, in the glow discharge decomposition method wherein the deposited film is formed under high output discharging, it is difficult to control stably the conditions with reproducibility, because no uniform distribution state of uniform discharging can be obtained, and further the high output discharging has great effect on the film during film formation. As the result, it is difficult to ensure uniformity in electrical and optical characteristics as well as stability in quality of the film formed, and disturbance of the film surface during deposition and defects within the deposited film are liable to occur. Particularly, it has been very difficult to form a film with large area or great thickness having uniform electrical and optical characteristics according to this method.

On the other hand, also in the heat energy deposition method, since a high temperature of 400° C. or higher is generally required, the substrate materials available are limited. Besides, since the probability of elimination of the useful bonded hydrogen atoms in a-Si is increased, desired film characteristics can be obtained with difficulty.

Accordingly, as one method of overcoming these problems, the photoenergy deposition method (hereinafter written as "photo-CVD") employing $SiH_4$ or $Si_2H_6$ as the starting material is recently attracting attention.

The photoenergy deposition method employs light as the excitation energy in place of glow discharge or heat in the above methods, and preparation of a deposited film of a-Si at a low energy level has been rendered practicable. Also, photoenergy can easily irradiate uniformly the starting gas and the film of high quality can be formed while maintaining uniformity with a lower energy consumption as compared with the deposition methods as described above. Also, the preparation conditions can easily be controlled to give stable reproducibility, and further the substrate is not required to be heated to a high temperature, whereby the scope of choice of the substrate can be broadened.

Whereas, in the photoenergy deposition method employing $SiH_4$ or $Si_2H_6$ as the starting material, decomposition with a dramatically good efficiency can be expected only to a limited extent. Accordingly, it has been pointed that film forming speed cannot be improved, thus posing a problem with respect to bulk productivity.

SUMMARY OF THE INVENTION

The present invention has been accomplished in view of such problems, and an object of the present invention is to provide a photoenergy deposition method by use of light as the excitation energy which is capable of forming a deposited film containing silicon atoms at high film forming speed and low energy level while maintaining high quality.

Another object of the present invention is to provide a method capable of forming a deposited film of high quality which has ensured uniformity in electrical and optical characteristics and stability in quality even in formation of the deposited film with a large area or a great thickness.

According to one aspect of the present invention, there is provided a method for forming a deposited film, which comprises forming a gaseous atmosphere of a silane compound represented by the general formula: $Si_nH_{2n+2}$ ($n \geq 1$) and a halogen compound in a deposition chamber in which a substrate is arranged, and exciting and decomposing these compounds by utilization of photoenergy thereby to form the deposited film containing silicon atom on said substrate.

According to another aspect of the present invention, there is provided method for forming a deposited film, which comprises forming a gaseous atmosphere of a silane compound represented by the general formula: $Si_nH_{2n+2}$ ($n \geq 1$), a halogen compound and a compound containing atoms belonging to the group III or the group V of the periodic table in a deposition chamber in which a substrate is arranged, and exciting and decomposing these compounds by utilization of photoenergy thereby to form a deposited film containing silicon atoms and the atoms belonging to the group III or the group V of the periodic table on said substrate.

BRIEF DESCRIPTION OF THE DRAWINGS

FIG. 2 shows schematically the section of the PIN type diode device which can be formed according to the method of the present invention.

DETAILED DESCRIPTION OF THE PREFERRED EMBODIMENTS

Figure 1:
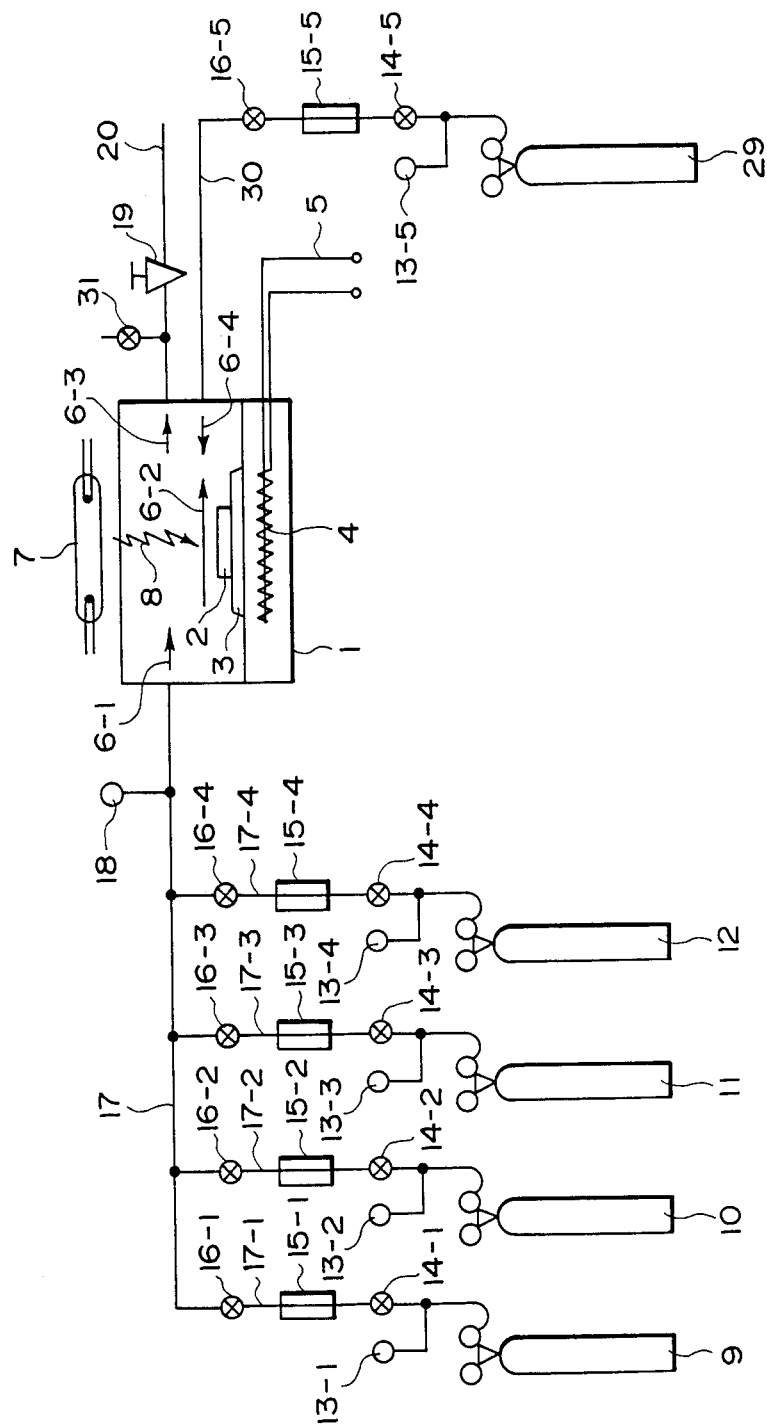
FIG. 1 shows schematically the construction of an embodiment of the device for forming a deposited film to be used in the method of the present invention.

The starting material for formation of an a-Si deposited film to be used in the method of the present invention is a silane compound represented by the general formula: $Si_nH_{2n+2}$ ($n \geq 1$). When said compound is a straight chain silane compound represented by the general formula: $Si_nH_{2n+2}$ ($n \geq 1$), in order to form the a-Si deposited film of good quality, n in the above formula should desirably be 1 to 15, preferably 2 to 10, more preferably 2 to 6.

On the other hand, when said compound is a chain silane compound having side chain represented by the general formula: $Si_nH_{2n+2}$ ($n \geq 4$), in order to form the a-Si deposited film of good quality, n in the above formula should desirably be 4 to 15, preferably 4 to 10, more preferably 4 to 7.

Examples of such compounds may include those represented by the following general formulae:

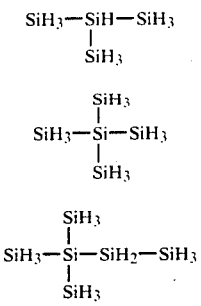

However, with such a straight chain silane compound or chain silane compound having side chain, when photoenergy is employed as the excitation energy, no excitation and decomposition with good efficiency can be obtained to give good film forming rate.

Accordingly, in the method of the present invention, for promoting more efficiently the excitation and decomposition of the above straight chain silane compound or the chain silane compound having side chain, a halogen compound is mixed with said straight chain silane compound or chain silane compound having side chain.

In the method of the present invention, the halogen compound to be mixed is a compound containing halogen atoms, which can promote more efficiently excitation and decomposition of the above straight chain silane compound or chain silane compound having said chain by the photoenergy. Such halogen compounds may include halogen gases such as $Cl_2$, $Br_2$, $I_2$, $F_2$ and the like.

The proportion of the halogen compound to be mixed in the above starting compound for formation of the a-Si film may be different depending on the starting compound for formation of a-Si film employed and the kind of the halogen compound, but it may be used within the range of from 0.001 Vol % to 95 Vol %, preferably from 0.1 Vol % to 70 Vol %.

The photoenergy as mentioned in the present invention refers to an energy ray which can give the sufficient excitation energy when irradiated on the above starting gas, and any one regardless of its wavelength region may be available, provided that it can excite and decompose the starting gas to deposit the decomposed product. Such a light energy may include, for example, UV-ray, IR-ray, visible light, X-ray and γ-ray, which may suitably be selected depending on adaptability for the starting gas.

In the method of the present invention, by introducing further a compound containing atoms belonging to the group III or the group V of the periodic table in addition to the above silicon compound and the halogen compound, there can be formed the deposited film containing silicon atoms and atoms belonging to the group III or the group V of the periodic table, which can be used for various purposes as a functional film such as a photoconductive film, semiconductor film and the like.

As the starting material to be used in the method of the present invention for introducing atoms belonging to the group III of the periodic table such as B, Al, Ga, In, Tl and the like or the group V of the periodic table such as N, P, As, Sb, Bi and the like, there may be employed the compound which contains these atoms which can readily be excited and decomposed with the photoenergy. Such compounds may include, for example, $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_6H_{10}$, $B_6H_{12}$, $AlCl_3$ and the like.

The method of the present invention is now described in detail below by referring to FIG. 1.

FIG. 1 shows schematically the construction of the deposited film forming device for forming a functional film such as a photoconductive film, a semiconductor film or an insulating film comprising a-Si.

Formation of the deposited film is conducted internally of the deposition chamber 1.

3 to be placed in deposition chamber 1 is a supporting stand on which the substrate is to be arranged.

4 is a heater for heating the substrate and current is supplied through conductive wire 5 to said heater 4. A gas introducing pipe 17 for introducing the starting gas formation of the above a-Si film and the gases such as carrier gas which may optionally be employed and a gas introducing pipe 30 for introducing the halogen compound as mentioned above into the deposition chamber 1 are connected to the deposition chamber 1. The other end of the gas introducing pipe 17 is connected to the gas feeding sources 9, 10, 11 and 12 for feeding the starting compound for formation of the above a-Si film and the gas such as carrier gas optionally employed and the like, and the other end of the gas introducing pipe 30 to the gas feeding source 29 for feeding a halogen compound. Thus, the starting compound for formation of the a-Si film and the halogen compound should preferably be introduced separately into the deposition chamber 1. This is because these compounds will react with each other on mixing when both are permitted to flow under mixed state through a gas introducing pipe, whereby decomposition of the starting material for formation of a-Si film will occur to deposit the decomposed product within the gas introducing pipe, thereby contaminating undesirably the innerside of the gas introducing pipe.

For measuring the flow amounts of respective gases flowed out from the gas feeding sources 9, 10, 11, 12 and 29 toward the deposition chamber 1, corresponding flow meters 15-1, 15-2, 15-3, 15-4 and 15-5 are provided in the course of the branched gas introducing pipes 17-1, 17-2, 17-3, 17-4 and the gas introducing pipe 30, respectively. Before and behind the respective flow meters, there are provided valves 14-1, 14-2, 14-3, 14-4, 14-5, 16-1, 16-2, 16-3, 16-4 and 16-5, and the required amounts of gases can be supplied by controlling these valves. 13-1, 13-2, 13-3, 13-4 and 13-5 are pressure meters for measuring the pressure on the higher pressure side of the corresponding flow meters.

The respective gases passed through the flow meters are led into the deposition chamber 1 placed under reduced pressure by means of an evacuation device not shown in the figure. The pressure meter 18 measures the total pressure of a gas mixture when it flow through the gas introducing pipe 17.

6-1 and 6-4 show the flow of the gases supplied from the gas introducing pipe.

6-2 shows the flow of the gas irradiated with the photoenergy.

For reducing the pressure in the deposition chamber 1 or evacuation of the introduced, a gas discharging pipe 20 is connected to the deposition chamber 1. The other end of the gas discharging pipe is connected to an evacuation device not shown in the figure.

6-3 shows the flow of the gas to be discharged.

7 is a photoenergy generating device.

When the deposition chamber 1 is not composed of a transparent material such as a quartz glass and the like, a window for irradiation of photoenergy 8 may be provided.

In the present invention, the number of the gas feeding sources 9, 10, 11, 12 and 29 may be increased or decreased suitably as desired.

In short, when a single starting gas is employed, the gas feeding sources from 9 to 12 can be only one. However, two or more sources are necessary when two or more kinds of starting gases are used as a mixture, or two or more single starting gases are to be mixed.

Of the starting compounds for formation of the a-Si film, compounds remain liquid without becoming gas at normal temperature, and when they are used as liquid, a gasifying device not shown in the figure is provided. The same is the case also concerning halogen compounds. The gasifying device may be one in which boiling by heating is utilized or carrier gas is passed through the liquid. The starting gas obtained by gasification is introduced through the flow meter into the deposition chamber 1.

By use of the device as shown in FIG. 1, the deposited film comprising a-Si can be formed according to the method of the present invention as follows.

First, a substrate 2 is set on the supporting stand 3 in the deposition chamber 1.

As the substrate 2, there may be employed various ones depending on the uses of the deposited films. The materials for said substrate may be conductive substrates, including metals or alloys such as NiCl, stainless steel, Al, Cr, Mo, Au, Nb, Ta, V, Ti, Pt, Pd and the like, semiconductive substrates such as semiconductors of Si, Ge and the like, or insulating substrates of synthetic resins such as polyester, polyethylene, polycarbonate, cellulose acetate, polypropylene, poly(vinyl chloride), poly(vinylidene chloride), polystyrene, polyamide and the like, gasses, ceramics, papers, etc. The shape and size of the substrate 2 may be determined suitably depending on the intended uses.

Particularly, according to the present invention, the substrate temperature can be made relatively lower in the order of about 50° to 150° C. Therefore, of the above materials for forming the substrate, those with low heat resistance which could not be applied for the flow discharge deposition method or the heat energy deposition method of the prior art can be used in the present invention.

After placing the substrate 2 on the supporting stand 3 in the deposition chamber 1, the air within the deposition chamber is evacuated through the gas discharging pipe 20 by means of an evacuation device not shown in the figure to bring the deposition chamber under reduced pressure. The pressure within the deposition chamber under reduced pressure should desirably be $5 \times 10^{-5}$ Torr or less, preferably $10^{-6}$ Torr or less.

When the deposition chamber 1 has been brought to reduced pressure, the substrate 3 is heated to a desired temperature by heater 4. The temperature of the substrate should preferably be made 50°-150° C., more preferably 50°-100° C.

Thus, in the method of the present invention, since the substrate temperature is relatively a lower temperature, requiring no heating to a high temperature as in the glow discharge deposition method or the heat energy deposition method, the energy consumption required therefor can be saved.

Next, the valves 14-1, 16-1 of the feeding source 9 in which a gas of the starting compound for Si supply for formation of a-Si film is stored are opened, respectively, to introduce the starting gas into the deposition chamber 1. Simultaneously with opening of these valves, the valves 14-5 and 16-5 are opened, respectively, to introduce a halogen compound gas from the feeding source 29.

The flow rates are controlled while measuring with the corresponding flow meters 15-1 and 15-5. Ordinarily, the flow rate of the starting gas may preferably be within range of from 10 to 100 SCCM, preferably from 20 to 500 SCCM.

The pressure of the starting gas for formation of a-Si film in the deposition chamber 1 should desirably be maintained at $10^{-2}$ to 100 Torr, preferably $10^{-2}$ to 1 Torr.

When the starting gas for formation of a-Si film and a halogen compound gas have been introduced into the deposition chamber 1, the photoenergy generating device 7 is driven and these gases are irradiated with the photoenergy.

As the photoenergy generating device 7, there may be employed, for example, a mercury lamp, a xenon lamp, a carbonic acid gas laser, argon ion laser or an excimer laser.

An optical system not shown in the figure is assembled in the device so that the desired photoenergy generated by driving the photoenergy generating device 7 may irradiate the substrate 2 placed in the deposition chamber 1.

The photoenergy may irradiate the gas flowing in the vicinity of the substrate 2 placed in the deposition chamber 1 uniformly or by controlling selectively the portion to be irradiated.

Thus, the photoenergy is imparted to the gas mixture flowing near the surface of the substrate 2 to promote efficiently photoexcitation and photolysis of the starting compound for formation of the a-Si film, whereby a-Si of the product formed can be deposited at high film forming speed. The starting gas employed in the method of the present invention, can readily be excited and decomposed by the photoenergy, through the action of a halogen compound as mentioned above, and therefore a film forming speed of about 5 to 100 Å/sec can be obtained. Decomposed products other than a-Si and superfluous starting gas not decomposed are discharged through the gas discharging pipe 20, while fresh starting gas and a halogen compound gas are fed continuously through the gas introducing pipes 17 and 30.

In the method of the present invention, the photoenergy is utilized as the excitation energy and this photoenergy can easily be controlled by use of an optical system so that it can irradiate constantly uniformly the predetermined space occupied by the gas to be irradiated with said energy, namely without occurrence of nonuniform distribution of excited energy. Also, there is no influence by high output discharging on the deposited film in the course of formation by the photoenergy itself, as observed in the glow discharge deposition method, and formation of the deposited film can be continued while maintaining uniformness without causing disturbance of the film surface during deposition or giving rise to defects in the deposited film. Particularly, since photoenergy can irradiate uniformly the space over a wide range, formation of the deposited film with a large area with good precision and uniformity is rendered possible.

Also, by controlling selectively the portion irradiated with photoenergy, it is possible to restrict the portion in which the deposited film is to be formed on the substrate.

In the present invention, excitation and decomposition of the starting gas with photoenergy includes not only the case where the starting gas is directly excited and decomposed, but also the case as the result of the accompanying effect by the photoenergy where photoenergy is absorbed by the starting gas or the substrate to be converted to heat energy, which the heat energy brings about excitation and decomposition of the starting gas.

Thus, an a-Si film is formed on the substrate 2, and when a desired film thickness has been obtained, irradiation of photoenergy from the photoenergy generating device is stopped, and further the valves 14-1, 14-5, 16-1 and 16-5 are closed to stop feeding of the starting gas. The film thickness of the a-Si film may be selected suitably as desired depending on the use of the a-Si film formed.

Next, by driving the evacuation device not shown in the figure, the gas in the deposition chamber is discharged and the heater 4 is turned off. When the substrate and the deposited film become normal temperature, the valve 31 is opened to introduce gradually the air into the deposition chamber and to return the deposition chamber to normal pressure, and the substrate having the a-Si film formed thereon is taken out.

19 is a gas discharging valve.

FIG. 2 is a schematic sectional view for illustration of the construction of a typical PIN type diode device obtained according to the present invention.

21 is a substrate, 22 and 26 are thin film electrodes, 23 is a P-type a-Si layer, 24 is an I-type a-Si layer, 25 is a N-type a-Si layer, 27 is a semiconductor layer and 28 is a conductive wire to be connected to the external electrical circuit device.

The thin film electrode 22 may be formed by providing a thin film of, for example, NiCr, Al, Cr, Mo, Au, Ir, Nb, Ta, V, Ti, Pt, Pd, $In_2O_3$, $SnO_2$, ITO ($In_2O_3+SnO_2$) on a substrate by use of the method such as vacuum vapor deposition, electron beam vapor deposition or sputtering.

The electrode 22 should desirably have a thickness of 30 to $5\times10^4$ Å, more preferably 100 to $5\times10^3$ Å.

For making each layer constituting the semiconductor layer 27 comprising a-Si N-type or P-type as desired, a N-type impurity or a P-type impurity may be doped in the layer to be formed while controlling its content during layer formation.

As the P-type impurity to be doped into the semiconductor layer, there may be included atoms belonging to the group III of the periodic table, above all, for example, B, Al, Ga, In and Tl as preferable ones, while as the N-type impurity, atoms belonging to the group V of the periodic table, above all, for example, N, P, As, Sb and Bi as preferable ones. In particular, B, Ga, P and Sb are most preferred.

The content of the impurity to be doped into the semiconductor layer 26 for imparting a desired conduction type in the present invention may suitably be determined corresponding to the desired electrical and optical characteristics, but it may be doped to a content within the range of from $3\times10^{-2}$ to 4 atomic % in the case of the impurity belonging to the group III of the periodic table, while it may be doped to a content within the range of from $5\times10^{-3}$ to 2 atomic % in the case of the impurity belonging to the group V of the periodic table.

For doping of such an impurity as mentioned above into the required layer in the layers constituting the semiconductor layer 27, a starting material for introduction of the impurity may be introudced into the deposition chamber at gaseous state during layer formation. As such starting materials for introduction of impurities, there may be employed those which are gaseous under normal temperature and normal pressure or are readily gasified by means of a gasifying device at least under the layer forming conditions.

Such starting materials for introduction of impurities (impurity gases) may include, as the materials for introduction of N-type impurities, $PH_3$, $P_2H_4$, $PF_3$, $PF_5$, $PCl_3$, $AsH_3$, $AsF_3$, $AsF_5$, $AsCl_3$, $SbH_3$, $SbF_5$ and $BiH_3$, while, as the materials for introduction of P-type impurities, $BF_3$, $BCl_3$, $BBr_3$, $B_2H_6$, $B_4H_{10}$, $B_5H_9$, $B_6H_{10}$, $B_6H_{12}$, $AlCl_3$ or the like.

In the following, a method for forming the semiconductor layer 27 is described in more detail.

First, the substrate 21 provided on its surface with the thin layer of the electrode 22 is placed on the supporting stand 3 in the deposition chamber 1, and the air in the deposition chamber is evacuated thorugh the gas discharging pipe 20 by means of an evacuation device not shown in the drawing to bring the deposition chamber under reduced pressure. The pressure in the deposition chamber under reduced pressure should desirably be $5\times10^{-5}$ Torr or less, preferably $10^{-6}$ Torr or less.

When the deposition chamber 1 has been brought to reduced pressure, current is passed through the heater to heat the substrate 21 mounted on the supporting stand 3 to a desired temperature.

Next, for laminating a P-type a-Si layer on the thin layer electrode 22 on the substrate 21, a gas mixture in which the starting gas for Si supply and a P-type impurity gas are mixed at a predetermined mixing ratio is introduced into the deposition chamber 1. The flow rate of the P-type impurity gas is determined from the flow rate of the starting gas x doping content.

Here, since the P-type or N-type impurity gas is very small in amount, for easy control of its flow rate, it is generally preferred to be stored at the state wherein the impurity gas is diluted to the predetermined concentration with $H_2$ gas, etc.

The photoenergy irradiates the introduced starting gas to form a P-type a-Si layer 23 on the substrate 21.

Similarly, by introducing a starting gas for feeding Si, the non-doped, namely I-type a-Si layer 24, and further by introducing a starting gas for feeding Si and a N-type impurity gas, a N-type a-Si layer 25 are formed.

Finally, on the N-type a-Si layer 25, according to the same method as information of the thin layer electrode 22, a thin layer electrode 26 is formed to the same thickness as the thin layer electrode 22, to complete preparation of the PIN type diode device.

The P-type a-Si layer may have a thickness of 100 to $10^4$ Å, preferably 300 to 2,000 Å.

The I-type a-Si layer may have a thickness of 500 to $5\times10^4$ Å, preferably 1000 to 10,000 Å.

The N-type a-Si layer 25 may have a thickness of 100 to $10^4$ Å, preferably 300 to 2,000 Å.

Formation of the deposited film according to the method of the present invention may be performed not only under reduced pressure, but also under normal pressure or under pressurization.

The present invention is described in more detail by referring to the following Examples.

EXAMPLE 1

By means of the device shown in FIG. 1, using $Si_2H_6$ as the starting material for formation of a-Si deposited film and further $I_2$ as the halogen compound, formation of I-type a-Si (amorphous-Si) film was practiced as follows.

First, a substrate (polyethyleneterephthalate) was set on the substrate stand 3 in the deposition chamber 1, the deposition chamber 1 was evacuated internally to $10^{-6}$ Torr through a gas discharging pipe 20 by an evacuation device (not shown). Subsequently, while maintaining the substrate temperature at 80° C. by passing current through the heater 4, the valves 14-1 and 16-1 of the starting material feeding source 9 filled with $Si_2H_6$ and the valves 14-5 and 16-5 of the feeding source 29 filled with $I_2$ were opened, respectively, to introduce the starting gas and the halogen compound gas into the deposition chamber 1.

The flow rate of $Si_2H_6$ gas was controlled to 150 SCCM and the flow rate of $I_2$ gas to 20 SCCM while measuring with corresponding flow meters 15-1 and 15-5, respectively. Next, while maintaining the pressure in the deposition chamber at 0.1 Torr, xenon light of an intensity of 130 mW/cm² was generated from the light energy generating device 7 to irradiated vertically the substrate, thereby depositing I-type a-Si film with a thickness of 5000 Å at a film forming speed of 50 Å/sec on the substrate 2. The light energy irradiated uniformly the gas flowing in the vicinity of the whole substrate 2 arranged in the deposition chamber 1. The decomposed products other than a-Si and superfluous starting gas not decomposed were discharged through the gas discharging pipe 20, while fresh starting gas and halogen compound gas were continuously fed through the gas introducing pipes 17 and 30.

The a-Si film thus formed according to the method of the present invention was evaluated by further forming a comb-shaped gas electrode of aluminum (length 250μ, width 5 mm) on each of the a-Si films formed on the substrate, measuring the photocurrent (photo irradiation intensity AMI: about 100 mW/cm²) and dark current, and determining the photoconductivity $\sigma_p$ and the ratio of photoconductivity $\sigma_p$ to dark conductivity $\sigma_d$ ($\sigma_p/\sigma_d$).

The gas electrode was formed by placing the a-Si film as formed above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The $\sigma_p$ value and $\sigma_p/\sigma_d$ ratio obtained are shown in Table 1.

EXAMPLES 2 AND 3

Except for employing $Br_2$ (Example 2) or $Cl_2$ (Example 3) as the halogen compound, formation of I-type a-Si film was practiced similarly as in Example 1, and the a-Si films obtained were evaluated similarly as in Example 1. The evaluation results are shown in Table 1.

EXAMPLES 4–12

Except for employing individually combinations of the straight chain silane compounds as enumerated in Table 1 and Table 2, and $I_2$, $Br_2$, $Cl_2$, respectively, as the starting material for formation of a-Si deposited film and the halogen compound, and setting the substrate temperature and the halogen gas flow rate as shown in Table 1 and Table 2, a-Si films were deposited in the same manner as in Example 1. The a-Si films obtained were evaluated similarly as in Example 1. The evaluation results are shown in Table 1 and Table 2.

COMPARATIVE EXAMPLES 1–4

Except for employing the straight chain silane compounds as enumerated in Table 1 and Table 2 as the starting material for formation of a-Si deposited films, setting the substrate temperature as shown in Table 1 and Table 2, and employing no halogen compound, a-Si films were deposited in the same manner as in Example 1. The a-Si films obtained were evaluated similarly as in Example 1. The evaluation results are shown in Table 1 and Table 2.

To summarize the results in Examples 1–12 and Comparative examples 1–4, as for film forming speed, as shown in the evaluation results in Table 1 and Table 2, when the corresponding Example and Comparative example employing the same kind of starting material for a-Si deposited film are compared, the film forming speed became greater by 2–4 times when mixed with a halogen compound as compared with the case when no halogen compound was mixed. The extent of promoting the film forming speed depends on the halogen employed and is generally greater in the order of $Cl_2$, $Br_2$ and $I_2$.

Also, every one of the a-Si films formed in, these Examples was also found to be good in electrical characteristics.

EXAMPLE 13

By means of the device shown in FIG. 1, using disilane as the starting material for Si supply, $I_2$ as the halogen compound and $B_2H_6$ as the gas for introduction of P-type impurity, formation of P-type a-Si layer doped with P-atoms was practiced as follows.

First, a substrate (polyethyleneterephthalate) was set on the substrate stand 3 in the deposition chamber 1, the deposition chamber 1 was evacuated internally to $10^{-6}$ Torr through a gas discharging pipe 20 by an evacuation device (not shown). Subsequently, while maintaining the substrate temperature at 80° C. by passing current through the heater 4, the valves 14-1 and 16-1 of the starting material feeding source 9 filled with $Si_2H_6$ and the valves 14-5 and 16-5 of the feeding source 29 filled with $I_2$, and further the valves 14-2 and 16-2 of the feeding source 10 filled with $B_2H_6$ for introduction of P-type impurity diluted with $H_2$ (to 1000 ppm) were opened, respectively, to introduce the starting gas mixture into the deposition chamber 1.

The flow rate of disilane was controlled to 150 SCCM, $B_2H_6$ gas to 40 SCCM and further $I_2$ gas to 20 SCCM while measuring with corresponding flow meters 15-1, 15-2 and 15-5, respectively.

Next, while maintaining the pressure in the deposition chamber at 0.1 Torr, xenon light of an intensity of 130 mW/cm² was generated from the light energy generating device 7 to irradiate vertically the substrate, thereby depositing P-type a-Si film 3 with a thickness of 400 Å

(B atom content ratio: $5 \times 10^{-3}$ atomic %) at a film forming speed of 50 Å/sec on the substrate 2. The light energy irradiated uniformly the gas flowing in the vicinity of the whole substrate 2 arranged in the deposition chamber 1. The decomposed products other than a-Si and B atoms, and superfluous starting gas not decomposed were discharged through the gas discharging pipe 20, while fresh starting gas and halogen compound gas were continuously fed through the gas introducing pipes 17 and 30.

The a-Si layer thus formed according to the method of the present invention was evaluated by further forming a comb-shaped gap electrode of aluminum (length 250μ, width 5 mm) on each of the a-Si film formed on the substrate, measuring the dark current, and determining the dark conductivity $\sigma_d$.

The gap electrode was formed by placing the a-Si film as formed above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The dark conductivity $\sigma_d$ obtained is shown in Table 3.

EXAMPLES 14 AND 15

Except for employing Br$_2$ (Example 14) or Cl$_2$ (Example 15) as the halogen compound, formation of I-type a-Si film was practiced similarly as in Example 13, and the a-Si films obtained were evaluated similarly as in Example 13. The evaluation results are shown in Table 3.

EXAMPLES 16-24

Except for employing individually combinations of the straight chain silane compounds as enumerated in Table 3 and Table 4 and I$_2$, Br$_2$, Cl$_2$, respectively, as the starting material for formation of a-Si deposited film and the halogen compound, and setting the substrate temperature and the halogen gas flow rate as shown in Table 3 and Table 4, a-Si films were deposited in the same manner as in Example 13. The a-Si films obtained were evaluated similarly as in Example 13. The evaluation results are shown in Table 3 and Table 4.

COMPARATIVE EXAMPLES 5-8

Except for employing the straight chain silane compounds as enumerated in Table 3 and Table 4 as the starting material for formation of a-Si deposited films, setting the substrate temperature as shown in Table 3 and Table 4, and employing no halogen compound, a-Si films were deposited in the same manner as in Example 13. The a-Si films obtained were evaluated similarly as in Example 13. The evaluation results are shown in Table 3 and Table 4.

EXAMPLES 25-36

Except for employing individually combinations of the straight chain silane compounds as enumerated in Table 3 and Table 4 and I$_2$, Br$_2$, Cl$_2$, respectively, as the starting material for a-Si supplying and the halogen compound, using N-type PH$_3$ as the gas for introduction of impurity and setting the substrate temperature and the halogen gas flow rate as shown in Table 5 and Table 6, a-Si films were deposited in the same manner as in Example 13. The a-Si films obtained were evaluated similarly as in Example 13. The evaluation results are shown in Table 5 and Table 6.

COMPARATIVE EXAMPLES 9-12

Except for employing the straight chain silane compounds as enumerated in Table 5 and Table 6 as the starting material for formation of a-Si deposited films, setting the substrate temperature as shown in Table 5 and Table 6, employing no halogen compound and employing N-type PH$_3$ as the gas for introduction of impurity, a-Si films were deposited in the same manner as in Example 13. The a-Si films obtained were evaluated similarly as in Example 13. The evaluation results are shown in Table 5 and Table 6.

When the corresponding Example and Comparative example employing the same kind of starting material for a-Si deposited film are compared, the film forming speed became greater by 2-4 times when mixed with a halogen compound as compared with the case when no halogen compound was mixed, in the case of doping with B$_2$H$_6$, while it was greater by 2-3 times in the case of doping with PH$_3$. The extent of promoting the film forming speed depends on the halogen employed and is generally greater in the order of Cl$_2$, Br$_2$ and I$_2$. Also, electrical characteristics were improved.

EXAMPLE 37

By means of the device shown in FIG. 1, using disilane as the starting material for Si supply and, xenon light with an intensity of 130 mW/cm$^2$ as the excitation energy, formation of a PIN type diode device as shown in FIG. 2 was practiced as follows.

First, a substrate 21 [polyethylenenaphthalate transparent electroconductive film having ITO (Indium Tin Oxide) deposited thereon to a thickness of 1000 Å] was set on the substrate stand 3 in the deposition chamber 1, and using the same operational conditions as in Example 13, disilane, B$_2$H$_6$ gas and I$_2$ gas were introduced from the starting material feeding sources 9, 10 and 29 into the deposition chamber 1 to form a P-type a-Si layer 23.

Next, when the thickness of the P-type a-Si layer 23 became 400 Å, all the valves 14-1, 16-1, 14-2, 16-2, 14-5 and 16-5 connected to the gas feeding sources 9, 10 and 29 were closed to stop introduction of the gases into the deposition chamber. After the gases in the deposition chamber were discharged by means of an evacuation device not shown, the valves 14-1, 16-1, 14-5 and 16-5 were opened again to introduce disilane for Si supply at a flow rate of 150 SCCM and I$_2$ gas at a flow rate of 20 SCCM into the deposition chamber 1.

Further, similarly as in formation of the P-type a-Si layer 23, photoenergy irradiation was effected to form a non-doped, namely I-type a-Si layer 24 (layer thickness: 5000 Å) at the same speed as in formation of the P-type a-Si layer 23.

As the next step, the valves 14-3 and 16-3 connected to the gas feeding source 11 in which the gas PH$_3$ for introducing N-type impurity diluted (to 0.05 mol %) with H$_2$ was stored were opened to introduce PH$_3$ gas into the deposition chamber 1. By use of the operational conditions as in Example 13, a N-type a-Si layer 25 (layer thickness 400 Å) doped with P atom was deposited on the I-type a-Si layer 24 at the same speed as in formation of the P-type a-Si layer 23, thus preparing a semiconductor layer 27 comprising the three a-Si layers 23, 24 and 25.

On the PIN type a-Si semiconductor layer 27 thus formed according to the method of the present invention, a thin film aluminum electrode with a thickness of 1000 Å were laminated by use of the vacuum deposition method (pressure $1 \times 10^{-5}$ Torr) to complete preparation of a PIN type diode device.

The PIN type diode device formed in this Example (area 1 cm$^2$) was evaluated for rectifying characteristics (ratio of current in normal direction to current in opposite direction at voltage of 1 V) and n-value (n-value in the current formula of P-N junction $J=J\{\exp(eV/nkT)-1\}$, respectively. The results are shown in Table 7.

EXAMPLES 38-48

Except for employing individually combinations of the straight chain silane compounds as enumerated in Table 3 and Table 4 and $I_2$, $Br_2$, $Cl_2$, respectively, as the starting material for formation of a-Si deposited film and the halogen compound, and setting the substrate temperature and the halogen gas flow rate as shown in Table 7 and Table 8, PIN type a-Si semiconductor layers with a three layer structure were formed in the same manner as in Example 37, to prepare PIN type diode devices. The rectifying characteristics, n-values and photoirradiation characteristics of the device thus prepared were evaluated similarly as in Example 37 to obtain the results as shown in Table 7 and Table 8.

COMPARATIVE EXAMPLES 13-16

Except for employing the straight chain silane compounds as enumerated in Table 7 and Table 8 as the feed gas for formation of a-Si deposited films, setting the substrate temperature as shown in Table 7 and Table 8, and employing no halogen compound, PIN type semiconductor layers with three layer structures were formed in the same manner as in Example 37 to prepare PIN type diode devices. The rectifying characteristics, n-values and photo-irradiation characteristics of the devices thus prepared were evaluated similarly as in Example 37 to obtain the results as shown in Table 7 and Table 8.

To summarize the results in Examples 37-48 and Comparative examples 13-16, the rectifying characteristics of the PIN type diode devices formed in Examples 37-48 were better when employing a halogen gas as compared with the case when employing no halogen gas, at a low substrate temperature of 50° to 100° C., provided that the same kind of a-Si feeding gas was employed.

EXAMPLE 49

By means of the device shown in FIG. 1, using the silane compound No. 1 as previously mentioned as the starting material for formation of a-Si deposited film and further $I_2$ as the halogen compound, formation of I-type a-Si (amorphous-Si) film was practiced as follows.

First, a substrate (polyethyleneterephthalate) was set on the substrate stand 3 in the deposition chamber 1, the deposition chamber was evacuated internally to $10^{-6}$ Torr through a gas discharging pipe 20 by an evacuation device (not shown). Subsequently, while maintaining the substrate temperature at 80° C. by passing current through the heater 4, the valves 14-1 and 16-1 of the starting material feeding source 9 filled with the silane compound No. 1 and the valves 14-5 and 16-5 of the feeding source 29 filled with $I_2$ were opened, respectively, to introduce the starting gas and the halogen compound gas into the deposition chamber 1.

The flow rate of the silane compound No. 1 was controlled to 150 SCCM and the flow rate of $I_2$ gas to 10 SCCM while measuring with corresponding flow meters 15-1 and 15-5, respectively. Next, while maintaining the pressure in the deposition chamber at 01. Torr, xenon light of an intensity of 130 mW/cm$^2$ was generated from the light energy generating device 7 to irradiate vertically the substrate, thereby depositing I-type a-Si film with a thickness of 5000 Å at a film forming speed of 30 Å/sec on the substrate 2. The light energy irradiated uniformly the gas flowing in the vicinity of the whole substrate 2 arranged in the deposition chamber 1. The decomposed products other than a-Si and superfluous starting gas not decomposed were discharged through the gas discharging pipe 20, while fresh starting gas and halogen compound gas were continuously fed through the gas introducing pipes 17 and 30.

The a-Si film thus formed according to the method of the present invention was evaluated by further forming a comb-shaped gas electrode of aluminum (length 250μ, width 5 mm) on each of the a-Si film formed on the substrate, measuring the photocurrent (photoirradiation intensity AMI: about 100 mW/cm$^2$) and dark current, and determining the photoconductivity $\sigma_p$ and the ratio of photoconductivity $\sigma_p$ to dark conductivity $\sigma_d$ ($\sigma_p/\sigma_d$).

The gap electrode was formed by placing the a-Si film as formed above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The $\sigma_p$ value and $\sigma_p/\sigma_d$ ratio obtained are shown in Table 9.

EXAMPLES 50 AND 51

Except for employing $Br_2$ (Example 50) or $Cl_2$ (Example 51) as the halogen compound, formation of I-type a-Si film was practiced similarly as in Example 49, and the a-Si films obtained were evaluated similarly as in Example 49. The evaluation results are shown in Table 9.

EXAMPLES 52-57

Except for employing individually combinations of the chain silane compounds No. 2 and No. 3 having side chains as previously mentioned and $I_2$, $Br_2$, $Cl_2$, respectively, as the starting material for formation of a-Si deposited film and the halogen compound, and setting the halogen gas flow rate as shown in Table 9 and Table 10, a-Si films were deposited in the same manner as in Example 49. The a-Si films obtained were evaluated similarly as in Example 49. The evaluation results are shown in Table 9 and Table 10.

COMPARATIVE EXAMPLES 17-19

Except for employing the chain silane compounds No. 1, No. 2 and No. 3 having side chains as previously mentioned as the starting material for formation of a-Si deposited films, and employing no halogen compound, a-Si films were deposited in the same manner as in Example 49. The a-Si films obtained were evaluated similarly as in Example 49. The evaluation results are shown in Table 9 and Table 10.

To summarize the results in Examples 49–57 and Comparative examples 17–19, as for film forming speed, as shown in the evaluation results in Table 9 and Table 10, when the corresponding Example and Comparative example employing the same kind of starting material for a-Si deposited film are compared, the film forming speed became greater by 2–3 times when mixed with a halogen compound as compared with the case when no halogen compound was mixed. The extent of promoting the film forming speed depends on the halogen employed and is generally greater in the order of $Cl_2$, $Br_2$ and $I_2$.

Also, everyone of the a-Si films formed in these Examples was also found to be good in electrical characteristics.

EXAMPLE 58

By means of the device shown in FIG. 1, using the silane compound No. 1 as mentioned above as the starting material for Si supply, $I_2$ as the halogen compound and $B_2H_6$ as the gas for introduction of P-type impurity, formation of P-type a-Si layer doped with P-atoms was practiced as follows.

First, a substrate (polyethyleneterephthalate) was set on the substrate stand 3 in the deposition chamber 1, the deposition chamber 1 was evacuated internally to $10^{-6}$ Torr through a gas discharging pipe 20 by an evacuation device (not shown). Subsequently, while maintaining the substrate temperature at 80° C. by passing current through the heater 4, the valves 14-1 and 16-1 of the starting material feeding source 9 filled with the silane compound No. 1 and the valves 14-5 and 16-5 of the feeding source 29 filled with $I_2$, and further the valves 14-2 and 16-2 of the feeding source 10 filled with $B_2H_6$ for introduction of P-type impurity diluted with $H_2$ (to 1000 ppm) were opened, respectively, to introduce the starting gas mixture into the deposition chamber 1.

The flow rate of the silane compound No. 1 was controlled to 150 SCCM, $B_2H_6$ gas to 40 SCCM and further $I_2$ gas to 10 SCCM while measuring with corresponding flow meters 15-1, 15-2 and 15-5, respectively.

Next, while maintaining the pressure in the deposition chamber at 0.1 Torr, xenon light of an intensity of 130 mW/cm$^2$ was generated from the light energy generating device 7 to irradiate vertically the substrate, thereby depositing P-type a-Si film 3 with a thickness of 400 Å (B atom content ratio: $5 \times 10^{-3}$ atomic %) at a film forming speed of 50 Å/sec on the substrate. The light energy irradiated uniformly the gas flowing in the vicinity of the whole substrate 2 arranged in the deposition chamber 1. The decomposed products other than a-Si and B atoms, and superfluous starting gas not decomposed were discharged through the gas discharging pipe 20, while fresh starting gas and halogen compound gas were continuously fed through the gas introducing pipes 17 and 30.

The a-Si layer thus formed according to the method of the present invention was evaluated by further forming a comb-shaped gap electrode of aluminum (length 250 μ, width 5 mm) on each of a a-Si film formed on the substrate, measuring the dark current, and determining the dark conductivity $\sigma_d$.

The gap electrode was formed by placing the a-Si film as formed above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The dark conductivity $\sigma_d$ obtained is shown in Table 11.

EXAMPLES 59 and 60

Except for employing $Br_2$ (Examples 59) or $Cl_2$ (Example 60) as the halogen compound, formation of I-type a-Si film was practiced similarly as in Example 58, and the a-Si films obtained were evaluated similarly as in Example 58. The evaluation results are shown in Table 11.

EXAMPLES 61–66

Except to employing individually combinations of the silicon compounds No. 2 and No. 3 as previously mentioned and $I_2$, $Br_2$, $Cl_2$, respectively, as the starting material for formation of a-Si deposited film and the halogen compound, and setting the halogen gas flow rate as shown in Table 11 and Table 12, a-Si films were deposited in the same manner as in Example 58. The a-Si films obtained were evaluated similarly as in examples 58. The evaluation results are shown in Table 11 and Table 12.

COMPARATIVE EXAMPLES 20–22

Except for employing the compounds No. 1, No. 2 and No. 3 as mentioned above as the starting material for formation of a-Si deposited film, and employing no halogen compound, a-Si films were deposited in the same manner as in the Example 58. The a-Si films obtained were evaluated similarly as in Example 58. The evaluation results are shown in Table 11 and Table 12.

EXAMPLES 67–75

Except for employing individually combinations of the compounds No. 1, No. 2 and No. 3 as mentioned above and $I_2$, $Br_2$, $Cl_2$, respectively, as the starting material for a-Si supplying and the halogen compound, using N-type $PH_3$ as the gas for introduction of impurity and setting the halogen gas flow rate as shown in Table 13 and Table 14, a-Si films were deposited in the same manner as in Example 58. The a-Si films obtened were evaluated similarly as in Example 58. The evaluation results are shown in Table 13 and Table 14.

COMPARATIVE EXAMPLE 23–25

Except for employing the silane compounds No. 1, No. 2 and No. 3 as mentioned above as the starting material for formation of a-Si deposited films, employing no halogen compound and employing N-type $PH_3$ as the gas for introduction of impurity, a-Si films were deposited in the same manner as in Example 58. The a-Si films obtained were evaluated similarly as in Example 58. The evaluation results are shown in Table 13 and Table 14.

When the corresponding Example and Comparative example employing the same kind of starting material for a-Si deposited film are compared, the film forming speed became greater by 2–3 times when mixed with a halogen compound as compared with the case when no halogen compound was mixed, in the case of doping with $B_2H_6$, while it was greater by 2–3 times in the case of doping with $PH_3$. The extent of promoting the film forming speed depends on the halogen employed and is generally greater in the order of $CL_2$, $Br_2$ and $I_2$. Also, electrical characteristics were improved.

EXAMPLE 76

By means of the device shown in FIG. 1, using the silicon compound No. 1 as previously mentioned as the starting material for Si supply and xenon light with an intensity of 130 mW/cm$_2$ as the excitation energy, formation of a PIN type diode device as shown in FIG. 2 was practiced as follows.

First, a substrate 21 [polyethylenenaphthalate transparent electroconductive film having ITO (Indium Tin Oxide) deposited thereon to a thickness of 1000 Å] was set on the substrate stand 3 in the deposition chamber 1, and using the same operational conditions as in Example 58, the silane compound No. 1, B$_2$H$_6$ gas and I$_2$ gas were introduced from the starting material feeding sources 9, 10 and 29 into the deposition chamber 1 to form a P-type a-Si layer 23.

Next, when the thickness of the P-type a-Si layer 23 became 400 Å all the valves 14-1, 16-1, 14-2, 16-2, 14-5 and 16-5 connected to the gas feeding sources 9, 10 and 29 were closed to stop introduction of the gases into the deposition chamber. After the gases in the deposition chamber were discharged by means of an evacuation device not shown, the valves 14-1, 16-1, 14-5 and 16-5 were opened again to introduce the silane compound No. 1 for Si supply at a flow rate of 150 SCCM and I$_2$ gas at a flow rate of 10 SCCM into the deposition chamber 1.

Further, similarly as in formation of the P-type a-Si layer 23, photoenergy irradiation was effected to form a non-doped, namely I-type a-Si layer 24 (layer thickness: 5000 Å) at the same speed as in formation of the P-type a-Si layer 23.

As the next step, the valves 14-3 and 16-3 connected to the gas feeding source 11 in which the gas PH$_3$ for introducing N-type impurity diluted (to 0.05 mol %) with H$_2$ gas stored were opened to introduce PH$_3$ gas into the deposition chamber 1. By use of the operational conditions as in Example 58, a N-type a-Si layer 25 (layer thickness: 400 Å) doped with P atom was deposited on the I-type a-Si layer 24 at the same speed as in formation of the P-type a-Si layer 23, thus preparing a semiconductor layer 27 comprising the three a-Si layers 23, 24, and 25.

On the PIN type a-Si semiconductor layer 27 thus formed according to the method of the present invention, a thin film aluminum electrode with a thickness of 1000 Å was laminated by use of the vacuum deposition method (pressure 1×10$^{-5}$ Torr) to complete preparation of a PIN type diode device.

The PIN type diode device formed in this Example (area 1 cm$^2$) was evaluated for rectifying characteristic (ratio of current in normal direction to current in opposite direction at voltage of 1 V) and n-value (n-value in the current formula of P-N junction J=J {exp (eV/nRT)−1}, respectively. The results are shown in Table 15.

EXAMPLES 77–84

Except for employing individually combinations of the silane compounds No. 1, No. 2 and No. 3 as mentioned above and I$_2$, Be$_2$, Cl$_2$, respectively, as the starting material for formation of a-Si deposited film and the halogen compound, and the halogen compound, and setting the substrate temperature and the halogen gas flow rate as shown in Table 15 and Table 16, PIN type a-Si semiconductor layers with a three layer structure were formed in the same manner as in Example 76 to prepare PIN type diode devices. The rectifying characteristics, n-values and photoirradiation characteristics thus prepared the devices were evaluated similarly as in Example 76 to obtain the results as shown in Table 15 and Table 16.

COMPARATIVE EXAMPLES 26–28

Except for employing the silane compounds No. 1, No. 2 and No. 3 as mentioned above as the feed gas for formation of a-Si deposited films, and employing no halogen compound, PIN type a-Si semiconductor layers with three layer structures were formed in the same manner as in Example 76 to prepare PIN type diode devices. The rectifying characteristics, n-values and photoirradiation characteristics thus prepared the devices were evaluated similarly as in Example 76 to obtain the results as shown in Table 15 and Table 16.

To summarize the results in Examples 76–84 and Comparative examples 26–28, the rectifying characteristics of the PIN type diode devices formed in Examples 76–84 were better when employing a halogen gas as compared with the case when employing no halogen gas, at a low substrate temperature of 50° to 100° C., provided that the same kind of a-Si feeding gas was employed.

As described in detail above, according to the method of the present invention, by use of a light energy as the excitation energy and by mixing a straight chain silane compound or a chain silane compound having side chain which is a starting material for Si supply for formation of a-Si film with a halogen compound, the straight chain silane compound or the chain silane compound having side chain can readily be excited and decomposed with good efficiency, whereby formation of a-Si deposited layer at a low energy level at a high film forming speed is rendered possible to enable formation of an a-Si deposited layer which is excellent in uniformity of electrical and optical characteristics as well as stability in quality. Accordingly, in the method of the present invention, it is possible to use a substrate comprising low heat resistance material which could not be utilized in the glow discharge deposition method or the heat energy deposition method of the prior art, and also energy consumption required for heating the substrate to a high temperature can be saved. Further, light energy can be easily controlled so as to irradiate constantly uniformly a given space occupied by the starting gas which in irradiated with said energy and therefore the deposited layer with a great thickness can be formed to a uniform thickness with good precision. In particular, since irradiation is possible over a wide range, a deposited layer with a large area can be formed uniformly with good precision.

TABLE 1

| No. | Comparative example 1 | Example 1 | Example 2 | Example 3 | Comparative example 2 | Example 4 | Example 5 | Example 6 |
|---|---|---|---|---|---|---|---|---|
| Starting material for formation of α-Si deposited film | SiH$_3$SiH$_3$ | | | | SiH$_4$ | | | |

TABLE 1-continued

| No. | Comparative example 1 | Example 1 | Example 2 | Example 3 | Comparative example 2 | Example 4 | Example 5 | Example 6 |
|---|---|---|---|---|---|---|---|---|
| Halogen gas Kind | | $I_2$ | $Br_2$ | $Cl_2$ | | $I_2$ | $Br_2$ | $Cl_2$ |
| Flow rate (SCCM) | | 20 | 20 | 20 | | 15 | 15 | 15 |
| Substrate temperature (°C.) | 80 | 80 | 80 | 80 | 100 | 100 | 100 | 100 |
| $\sigma_p/\sigma d$ ($\times 10^4$) *1 | 0.11 | 4.5 | 3.8 | 3.5 | 0.09 | 2.5 | 3.5 | 2.0 |
| $\sigma_p$ ($\times 10^{-5}$) *2 | 1.0 | 3.2 | 2.8 | 2.5 | 1.95 | 3.0 | 3.5 | 3.2 |
| Film forming speed (Å/sec) | 13 | 50 | 43 | 40 | 8 | 30 | 26 | 18 |

*1 $\sigma_p/\sigma d$: Ratio of photoconductivity to dark conductivity
*2 $\sigma_p$: Photoconductivity $(\Omega \cdot cm)^{-1}$

TABLE 2

| No. | Comparative example 3 | Example 7 | Example 8 | Example 9 | Comparative example 4 | Example 10 | Example 11 | Example 12 |
|---|---|---|---|---|---|---|---|---|
| Starting material for formation of α-Si deposited film | | $SiH_3SiH_2SiH_3$ | | | | $SiH_3(SiH_2)_3SiH_3$ | | |
| Halogen gas Kind | | $I_2$ | $Br_2$ | $Cl_2$ | | $I_2$ | $Br_2$ | $Cl_2$ |
| Flow rate (SCCM) | | 25 | 25 | 25 | | 20 | 20 | 20 |
| Substrate temperature (°C.) | 70 | 70 | 70 | 70 | 50 | 50 | 50 | 50 |
| $\sigma_p/\sigma d$ ($\times 10^4$) *1 | 0.12 | 4.0 | 3.2 | 4.5 | 0.11 | 2.0 | 1.8 | 2.5 |
| $\sigma_p$ ($\times 10^{-5}$) *2 | 1.0 | 4.0 | 2.3 | 3.5 | 1.0 | 3.2 | 3.8 | 4.0 |
| Film forming speed (Å/sec) | 18 | 50 | 45 | 40 | 18 | 51 | 43 | 40 |

*1 $\sigma_p/\sigma d$: Ratio of photoconductivity to dark conductivity
*2 $\sigma_p$: Photoconductivity $(\Omega \cdot cm)^{-1}$

TABLE 3

| No. | Comparative example 5 | Example 13 | Example 14 | Example 15 | Comparative example 6 | Example 16 | Example 17 | Example 18 |
|---|---|---|---|---|---|---|---|---|
| α-Si feeding material | | $SiH_3SiH_3$ | | | | $SiH_4$ | | |
| Halogen gas Kind | | $I_2$ | $Br_2$ | $Cl_2$ | | $I_2$ | $Br_2$ | $Cl_2$ |
| Flow rate (SCCM) | | 20 | 20 | 20 | | 15 | 15 | 15 |
| Substrate temperature (°C.) | 80 | 80 | 80 | 80 | 100 | 100 | 100 | 100 |
| $\sigma_d(B_2H_6)$ ($\times 10^{-2}$) *1 | 2.4 | 2.7 | 2.8 | 3.6 | 2.2 | 3.2 | 3.4 | 3.0 |
| Film forming speed (Å/sec) | 13 | 50 | 43 | 40 | 8 | 30 | 26 | 18 |

*1 Dark conductivity when employing $B_2H_6$ as doping gas $(\Omega \cdot cm)^{-1}$

TABLE 4

| No. | Comparative example 7 | Example 19 | Example 20 | Example 21 | Comparative example 8 | Example 22 | Example 23 | Example 24 |
|---|---|---|---|---|---|---|---|---|
| α-Si feeding material | | $SiH_3SiH_2SiH_3$ | | | | $SiH_3(SiH_2)_3SiH_3$ | | |
| Halogen gas Kind | | $I_2$ | $Br_2$ | $Cl_2$ | | $I_2$ | $Br_2$ | $Cl_2$ |
| Flow rate (SCCM) | | 25 | 25 | 25 | | 20 | 20 | 20 |
| Substrate temperature (°C.) | 70 | 70 | 70 | 70 | 50 | 50 | 50 | 50 |
| $\sigma_d(B_2H_6)$ ($\times 10^{-2}$) *1 | 2.2 | 2.8 | 2.6 | 2.8 | 2.2 | 2.6 | 2.8 | 3.0 |
| Film forming speed (Å/sec) | 13 | 50 | 43 | 40 | 8 | 30 | 26 | 18 |

*1 Dark conductivity when employing $B_2H_6$ as doping gas $(\Omega \cdot cm)^{-1}$

TABLE 5

| No. | Comparative example 9 | Example 25 | Example 26 | Example 27 | Comparative example 10 | Example 28 | Example 29 | Example 30 |
|---|---|---|---|---|---|---|---|---|
| α-Si feeding material | | $SiH_3SiH_3$ | | | | $SiH_4$ | | |
| Halogen gas Kind | | $I_2$ | $Br_2$ | $Cl_2$ | | $I_2$ | $Br_2$ | $Cl_2$ |
| Flow rate | | 20 | 20 | 20 | | 15 | 15 | 15 |

TABLE 5-continued

| No. | Comparative example 9 | Example 25 | Example 26 | Example 27 | Comparative example 10 | Example 28 | Example 29 | Example 30 |
|---|---|---|---|---|---|---|---|---|
| (SCCM) | | | | | | | | |
| Substrate temperature (°C.) | 80 | 80 | 80 | 80 | 100 | 100 | 100 | 100 |
| $\sigma_d(PH_3)$ ($\times 10^{-1}$) *2 | 2.2 | 3.8 | 3.3 | 4.5 | 2.8 | 3.6 | 3.3 | 2.8 |
| Film forming speed (Å/sec) | 18 | 50 | 45 | 40 | 18 | 51 | 43 | 40 |

*2 Dark conductivity when employing $PH_3$ as doping gas $(\Omega \cdot cm)^{-1}$

TABLE 6

| No. | Comparative example 11 | Example 31 | Example 32 | Example 33 | Comparative example 12 | Example 34 | Example 35 | Example 36 |
|---|---|---|---|---|---|---|---|---|
| α-Si feeding material | $SiH_3SiH_2SiH_3$ | | | | $SiH_3(SiH_2)_3SiH_3$ | | | |
| Halogen gas  Kind | | $I_2$ | $Br_2$ | $Cl_2$ | | $I_2$ | $Br_2$ | $Cl_2$ |
| Flow rate (SCCM) | | 25 | 25 | 25 | | 20 | 20 | 20 |
| Substrate temperature (°C.) | 70 | 70 | 70 | 70 | 50 | 50 | 50 | 50 |
| $\sigma_d(PH_3)$ ($\times 10^{-1}$) *2 | 2.2 | 2.8 | 2.6 | 2.0 | 2.1 | 4.3 | 4.0 | 2.1 |
| Film forming speed (Å/sec) | 18 | 50 | 45 | 40 | 18 | 51 | 43 | 40 |

*2 Dark conductivity when employing $PH_3$ as doping gas $(\Omega \cdot cm)^{-1}$

TABLE 7

| No. | Comparative example 13 | Example 37 | Example 38 | Example 39 | Comparative example 14 | Example 40 | Example 41 | Example 42 |
|---|---|---|---|---|---|---|---|---|
| α-Si feeding material | $SiH_3SiH_3$ | | | | $SiH_4$ | | | |
| Halogen gas  Kind | | $I_2$ | $Br_2$ | $Cl_2$ | | $I_2$ | $Br_2$ | $Cl_2$ |
| Flow rate (SCCM) | | 20 | 20 | 20 | | 15 | 15 | 15 |
| Substrate temperature (°C.) | 80 | 80 | 80 | 80 | 100 | 100 | 100 | 100 |
| Rectifying value of diode *3 | 6 | 7.1 | 7.0 | 7.5 | 5.8 | 6.3 | 6.5 | 6.4 |
| n-value of diode ($\times 10^{-7}$) *4 | 1.3 | 1.15 | 1.10 | 1.20 | 1.2 | 1.20 | 1.25 | 1.15 |

*3 Ratio of current in normal direction to current in opposite direction at voltage of 1 V (represented in logarithm)
*4 n-value (quality factor) in the current formula of p-n junction $J = J_s \{exp(eV/nRT)-1\}$

TABLE 8

| No. | Comparative example 15 | Example 43 | Example 44 | Example 45 | Comparative example 16 | Example 46 | Example 47 | Example 48 |
|---|---|---|---|---|---|---|---|---|
| α-Si feeding material | $SiH_3SiH_2SiH_3$ | | | | $SiH_3(SiH_2)_3SiH_3$ | | | |
| Halogen gas  Kind | | $I_2$ | $Br_2$ | $Cl_2$ | | $I_2$ | $Br_2$ | $Cl_2$ |
| Flow rate (SCCM) | | 25 | 25 | 25 | | 20 | 20 | 20 |
| Substrate temperature (°C.) | 70 | 70 | 70 | 70 | 50 | 50 | 50 | 50 |
| Rectifying value of diode *3 | 6.0 | 8.2 | 8.0 | 7.5 | 5.8 | 7.2 | 6.8 | 7.0 |
| n-value of diode ($\times 10^{-7}$) *4 | 1.3 | 1.10 | 1.15 | 1.20 | 1.2 | 1.25 | 1.15 | 1.10 |

*3 Ratio of current in normal direction to current in opposite direction at voltage of 1 V (represented in logarithm)
*4 n-value (Quality factor) in the current formula of p-n junction $J = J_s \{exp(eV/nRT)-1\}$

TABLE 9

| No. | Comparative example 17 | Example 49 | Example 50 | Example 51 | Comparative example 18 | Example 52 | Example 53 | Example 54 |
|---|---|---|---|---|---|---|---|---|
| Starting material for formation of α-Si deposited film | | No. 1 | | | | No. 2 | | |
| Halogen gas  Kind | | $I_2$ | $Br_2$ | $Cl_2$ | | $I_2$ | $Br_2$ | $Cl_2$ |
| Flow rate (SCCM) | | 10 | 10 | 10 | | 15 | 15 | 15 |
| Substrate temperature | 80 | 80 | 80 | 80 | 80 | 80 | 80 | 80 |

TABLE 9-continued

| No. | Comparative example 17 | Example 49 | Example 50 | Example 51 | Comparative example 18 | Example 52 | Example 53 | Example 54 |
|---|---|---|---|---|---|---|---|---|
| (°C.) | | | | | | | | |
| $\sigma_p/\sigma_d$ ($\times 10^4$) *1 | 3.5 | 4.0 | 4.2 | 4.3 | 3.3 | 3.8 | 4.0 | 4.5 |
| $\sigma_p$ ($\times 10^{-5}$) *2 | 2.0 | 3.5 | 3.0 | 3.8 | 1.1 | 2.0 | 1.5 | 1.3 |
| Film forming speed (Å/sec) | 15 | 30 | 28 | 23 | 10 | 30 | 24 | 20 |

*1 $\sigma_p/\sigma_d$: Ratio of photoconductivity to dark conductivity
*2 $\sigma_p$: Photoconductivity $(\Omega \cdot cm)^{-1}$

TABLE 10

| No. | Comparative example 19 | Example 55 | Example 56 | Example 57 |
|---|---|---|---|---|
| Starting material for formation of α-Si deposited film | | No. 3 | | |
| Halogen gas Kind | | $I_2$ | $Br_2$ | $Cl_2$ |
| Flow rate (SCCM) | | 20 | 20 | 20 |
| Substrate temperature (°C.) | 80 | 80 | 80 | 80 |
| $\sigma_p/\sigma_d$ ($\times 10^4$) *1 | 3.0 | 3.5 | 2.7 | 4.0 |
| $\sigma_p$ ($\times 10^{-5}$) *2 | 1.1 | 1.5 | 1.8 | 2.5 |
| Film forming speed (Å/sec) | 10 | 30 | 28 | 20 |

*1 $\sigma_p/\sigma_d$: Ratio of photoconductivity to dark conductivity
*2 $\sigma_p$: Photoconductivity $(\Omega \cdot cm)^{-1}$

TABLE 11

| No. | Comparative example 20 | Example 58 | Example 59 | Example 60 | Comparative example 21 | Example 61 | Example 62 | Example 63 |
|---|---|---|---|---|---|---|---|---|
| α-Si feeding material | | No. 1 | | | | No. 2 | | |
| Halogen gas Kind | | $I_2$ | $Br_2$ | $Cl_2$ | | $I_2$ | $Br_2$ | $Cl_2$ |
| Flow rate (SCCM) | | 10 | 10 | 10 | | 15 | 15 | 15 |
| Substrate temperature (°C.) | 80 | 80 | 80 | 80 | 80 | 80 | 80 | 80 |
| $\sigma_d$ ($B_2H_6$) ($\times 10^{-2}$) *1 | 2.0 | 2.8 | 3.4 | 4.2 | 1.9 | 2.3 | 1.0 | 5.2 |
| Film forming speed (Å/sec) | 15 | 30 | 28 | 23 | 10 | 30 | 24 | 20 |

*1 Dark conductivity when employing $B_2H_6$ as doping gas $(\Omega \cdot cm)^{-1}$

TABLE 12

| No. | Comparative example 22 | Example 64 | Example 65 | Example 66 |
|---|---|---|---|---|
| α-Si feeding material | | No. 3 | | |
| Halogen gas Kind | | $I_2$ | $Br_2$ | $Cl_2$ |
| Flow rate (SCCM) | | 20 | 20 | 20 |
| Substrate temperature (°C.) | 80 | 80 | 80 | 80 |
| $\sigma_d$ ($B_2H_6$) ($\times 10^{-2}$) *1 | 1.0 | 1.5 | 2.0 | 2.5 |
| Film forming speed (Å/sec) | 10 | 28 | 24 | 20 |

*1 Dark conductivity when employing $B_2H_6$ as doping gas $(\Omega \cdot cm)^{-1}$

TABLE 13

| No. | Comparative example 23 | Example 67 | Example 68 | Example 69 | Comparative example 24 | Example 70 | Example 71 | Example 72 |
|---|---|---|---|---|---|---|---|---|
| α-Si feeding material | | No. 1 | | | | No. 2 | | |
| Halogen gas Kind | | $I_2$ | $Br_2$ | $Cl_2$ | | $I_2$ | $Br_2$ | $Cl_2$ |
| Flow rate (SCCM) | | 10 | 10 | 10 | | 15 | 15 | 15 |
| Substrate temperature (°C.) | 80 | 80 | 80 | 80 | 80 | 80 | 80 | 80 |
| $\sigma_d$ ($PH_3$) ($\times 10^{-1}$) *2 | 4.0 | 5.2 | 5.0 | 4.5 | 1.2 | 3.5 | 4.0 | 2.0 |
| Film forming speed (Å/sec) | 15 | 30 | 29 | 23 | 10 | 30 | 24 | 20 |

*1 Dark conductivity when employing $PH_3$ as doping gas $(\Omega \cdot cm)^{-1}$

TABLE 14

| No. | Comparative example 25 | Example 73 | Example 74 | Example 75 |
|---|---|---|---|---|
| α-Si feeding material | | No. 3 | | |
| Halogen gas Kind | | $I_2$ | $Br_2$ | $Cl_2$ |
| Flow rate (SCCM) | | 20 | 20 | 20 |
| Substrate temperature (°C.) | 80 | 80 | 80 | 80 |
| $\sigma_d$($PH_3$) ($\times 10^{-2}$) *2 | 1.2 | 2.5 | 2.8 | 3.5 |
| Film forming speed (Å/sec) | 10 | 28 | 24 | 20 |

*2 Dark conductivity when employing $PH_3$ as doping gas $(\Omega \cdot cm)^{-1}$

TABLE 15

| No. | Comparative example 26 | Example 76 | Example 77 | Example 78 | Comparative example 27 | Example 79 | Example 80 | Example 81 |
|---|---|---|---|---|---|---|---|---|
| α-Si feeding material | | No. 1 | | | | No. 2 | | |
| Halogen gas  Kind | | $I_2$ | $Br_2$ | $Cl_2$ | | $I_2$ | $Br_2$ | $Cl_2$ |
| Flow rate (SCCM) | | 10 | 10 | 10 | | 15 | 15 | 15 |
| Substrate temperature (°C.) | 80 | 80 | 80 | 80 | 80 | 80 | 80 | 80 |
| Rectifying value of diode *3 | 6 | 7.3 | 7.0 | 7.5 | 5.6 | 8.2 | 8.1 | 8.0 |
| n-value of diode ($\times 10^{-7}$) *4 | 1.3 | 1.10 | 1.09 | 1.21 | 1.2 | 1.25 | 1.20 | 1.18 |

*3 Ratio of current in normal direction to current in opposite direction at voltage of 1 V (represented in logarithm)
*4 n-value (Quality factor) in the current formula of p-n junction $J = J_s \{\exp(eV/nRT) - 1\}$

TABLE 16

| No. | Comparative example 28 | Example 82 | Example 83 | Example 84 |
|---|---|---|---|---|
| α-Si feeding material | | No. 3 | | |
| Halogen gas  Kind | | $I_2$ | $Br_2$ | $Cl_2$ |
| Flow rate (SCCM) | | 20 | 20 | 20 |
| Substrate temperature (°C.) | 80 | 80 | 80 | 80 |
| Rectifying value *3 of diode | 5.5 | 6.4 | 6.8 | 7.5 |
| n-value of diode *4 ($\times 10^{-7}$) | 1.0 | 1.11 | 1.13 | 1.05 |

*3 Ratio of current in normal direction to current in opposite direction at voltage of 1 V (represented in logarithm)
*4 n-value (Quality factor) in the current formula of p-n junction $J = J_s \{\exp(eV/nRT) - 1\}$

We claim:

1. A photolytic method for forming a deposited film, which comprises forming a gaseous atmosphere of a silane compound represented by the general formula: $Si_nH_{2n+2}(n \geq 1)$ and a halogen compound selected from the group comprised of $Cl_2$, $Br_2$, $I_2$ and $F_2$, in a deposition chamber in which a substrate is arranged, and exciting and decomposing these compounds by utilization of photoenergy thereby to form the deposited film containing silicon atoms on said substrate whereby the deposited film may be formed at substrate temperatures on the order of about 50° to 150° C., and without application of thermal energy to excite and decompose the compounds.

2. A method according to claim 1, wherein the silane compound is a straight chain silane compound represented by the general formula: $Si_nH_{2n+2}(n \geq 1)$.

3. A method according to claim 1, wherein the silane compound is a chain silane compound having side chain represented by the general formula: $Si_nH_{2n+2}(n \geq 4)$.

4. A photolytic method for forming a deposited film, which comprises forming a gaseous atmosphere of a silane compound represented by the general formula: $Si_nH_{2n+2}(n \geq 1)$, a halogen compound selected from the group comprised of $Cl_2$, $Br_2$, $I_2$ and $F_2$, and a compound containing atoms belonging to the group III or the group V of the periodic table in a deposition chamber in which a substrate is arranged, and exciting and decomposing these compounds by utilization of photoenergy thereby to form a deposited film containing silicon atoms and the atoms belonging to the group III or the group V of the periodic table on said substrate, whereby the deposited film may be formed at substrate temperatures on the order of about 50° to 150° C. and without application of thermal energy to excite and decompose the compounds.

5. A method according to claim 4, wherein the atoms of the group III of the periodic table are selected from B, Al, Ga, In and Tl.

6. A method according to claim 4, wherein the atoms of the group V of the periodic table are selected from N, P, As, Sb and Bi.

7. A method according to claim 1, wherein the photoenergy utilized is selected from UV-ray, IR-ray, visible light, X-ray and γ-ray.

8. A method according to claim 3, wherein the chain silane compound having side chain is selected from the compounds No. 1–No. 3 shown below:

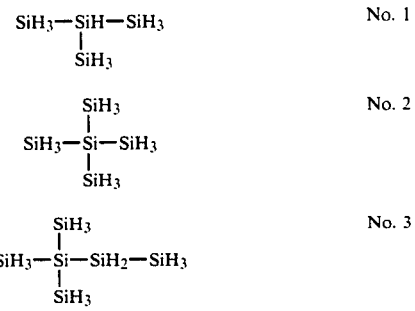

9. A method according to claim 1 including maintaining the substrate temperature from about 50° to 150° C. during film formation.

* * * * *

UNITED STATES PATENT AND TRADEMARK OFFICE
CERTIFICATE OF CORRECTION

PATENT NO. : 4,683,144            Page 1 of 4
DATED : July 28, 1987
INVENTOR(S) : YUKUO NISHIMURA, ET AL.

It is certified that error appears in the above-identified patent and that said Letters Patent is hereby corrected as shown below:

AT [57] IN THE ABSTRACT

Line 13, "too" should read --to--.

COLUMN 1

Line 12, "a" should read --an--.

COLUMN 2

Line 31, "method" should read --a method--.

COLUMN 3

Line 17, "siliane" should read -silane--.
Line 33, "said" should read --side--.

COLUMN 4

Line 67, "the" should read --the gas--.

COLUMN 5

Line 50, "flow" should read --glow--.
Line 62, "substrate 3" should read --substrate 2--.

COLUMN 7

Line 65, "26" should read --27--.

UNITED STATES PATENT AND TRADEMARK OFFICE
CERTIFICATE OF CORRECTION

PATENT NO. : 4,683,144  
DATED : July 28, 1987  
INVENTOR(S) : YUKUO NISHIMURA, ET AL.

It is certified that error appears in the above-identified patent and that said Letters Patent is hereby corrected as shown below:

COLUMN 8

Line 10,   "introudced" should read --introduced--.  
    Line 29,   "thorugh" should read --through--.  
    Line 46,   "x doping content" should be deleted.  
    Line 59,   "information" should read --in formation--.

COLUMN 9

Line 32,   "irradiated" should read --irradiate--.

COLUMN 10

Line 36,   "in," should read --in--.

COLUMN 11

Line 63,   "a-Si supplying" should read --supplying a-Si--.

COLUMN 13

Line 2,   "were" should read --was--.

COLUMN 14

Line 5,   "01. Torr," should read --0.1 Torr,--.

COLUMN 15

Line 13,   "everyone" should read --each--.  
    Line 47,   "film 3" should read --film--.

UNITED STATES PATENT AND TRADEMARK OFFICE
CERTIFICATE OF CORRECTION

PATENT NO. : 4,683,144

DATED : July 28, 1987

INVENTOR(S) : YUKUO NISHIMURA, ET AL.

It is certified that error appears in the above-identified patent and that said Letters Patent is hereby corrected as shown below:

COLUMN 16

Line 40, "a-Si supplying" should read --supplying a-Si--.
Line 44, "obtaned" should read --obtained--.
Line 47, "EXAMPLE 23-25" should read --EXAMPLES 23-29--.

COLUMN 17

Line 6, "mW/cm$_2$" should read --mW/cm$^2$--.
Line 14, "B$_2$H$_6$gas" should read --B$_2$H$_6$ gas--.
Line 14, "I$_2$gas" should read --I$_2$ gas--.

COLUMN 18

Line 10, "thus prepared the" should read --of the thus prepared--.
Line 22, "thus prepared the" should read --of the thus prepared--.

COLUMN 23/TABLE 11

Line 57, "$\Omega \cdot$cm)$^1$" should read --$\Omega \cdot$cm)$^{-1}$--.

COLUMN 24/TABLE 14

Line 68, "($\Omega \cdot$cm)$^1$" should read --($\Omega \cdot$cm)$^{-1}$--.

UNITED STATES PATENT AND TRADEMARK OFFICE
CERTIFICATE OF CORRECTION

PATENT NO. : 4,683,144                            Page 4 of 4

DATED : July 28, 1987

INVENTOR(S) : YUKUO NISHIMURA, ET AL.

It is certified that error appears in the above-identified patent and that said Letters Patent is hereby corrected as shown below:

COLUMN 25

Line 42, "substrate" should read --substrate,--.

Signed and Sealed this

Twenty-ninth Day of March, 1988

Attest:

DONALD J. QUIGG

Attesting Officer          Commissioner of Patents and Trademarks